United States Patent [19]
Ganapol

[11] Patent Number: 5,124,644
[45] Date of Patent: Jun. 23, 1992

[54] SYSTEM FOR POSITIONING A SEMICONDUCTOR CHIP PACKAGE WITH RESPECT TO A TESTING DEVICE

[75] Inventor: David L. Ganapol, Scotts Valley, Calif.

[73] Assignee: VLSI Technology, Inc., San Jose, Calif.

[21] Appl. No.: 630,115

[22] Filed: Dec. 19, 1990

[51] Int. Cl.⁵ ............................................. G01R 31/02
[52] U.S. Cl. .................... 324/158 F; 324/73.1; 324/158 R; 324/158 P
[58] Field of Search ............... 324/158 F, 158 P, 73.1, 324/158 R; 209/573, 549; 414/222, 417; 198/470.1; 250/201.4, 561; 356/394; 318/652; 358/101, 106; 382/8; 439/68, 70, 264

[56] References Cited

U.S. PATENT DOCUMENTS

| | | | |
|---|---|---|---|
| 3,896,935 | 7/1975 | Hjelle et al. | 324/158 T |
| 4,478,352 | 10/1984 | Amundson et al. | 324/158 F |
| 4,739,175 | 4/1988 | Tamura | 250/224 |
| 4,758,785 | 7/1988 | Rath | 324/158 F |
| 4,818,382 | 4/1989 | Anderson et al. | 324/158 F |
| 4,839,587 | 6/1989 | Flatley et al. | 324/158 F |
| 4,862,510 | 8/1989 | Duncan et al. | 250/561 |
| 4,996,439 | 2/1991 | Linker | 250/561 |

*Primary Examiner*—Vinh Nguyen
*Attorney, Agent, or Firm*—Majestic, Parson, Siebert & Hsue

[57] ABSTRACT

In a system for positioning a semiconductor chip package with respect to a testing surface, the distance between the package or the leads thereof and the testing surface is monitored while the package is pushed towards the testing surface. When the distance monitored falls below a certain value, the package is pushed further by a set distance. In this manner, good contact between the leads of the package and the contacts of the testing surface is achieved without destroying the coplanarity of the leads.

10 Claims, 2 Drawing Sheets

SYSTEM FOR POSITIONING A SEMICONDUCTOR CHIP PACKAGE WITH RESPECT TO A TESTING DEVICE

BACKGROUND OF THE INVENTION

This invention relates in general to systems and accessories used for testing a semiconductor chip package and in particular, to a system for handling and positioning a semiconductor chip package with respect to a testing device for testing the package.

Semiconductor chip packages such as plastic lead chip carriers (PLCC) need to be tested before they are shipped to customers. Typically, the leads of such packages are connected to testing equipment for testing the performance of circuits in the semiconductor chip. For packages having leads which are coplanar, such as quad flat packs or PLCC, the semiconductor chip package is slid down a channel until it is stopped by a stopper. The stopper is positioned such that when it stops the package, the package is adjacent to a testing surface with electrical contacts on the surface for contacting the flat and coplanar side surfaces of end portions of the leads of the package. The package is fed to the channel so that the coplanar side surfaces of the end portions of the leads face the contacts on the testing surface.

When the package is stopped by the stopper so that the package is in adjacent to the contacts on the testing surface, the presence of the package in this position is sensed by a light sensor which supplies a signal to activate a solenoid. The solenoid in turn applies a force to a plunger to move the package towards the testing surface until the substantially coplanar side surfaces of the end portions of the leads of the package are in contact with the contacts on the testing surface. Various signals are then applied to the leads of the package through the contacts in order to test the performance of the circuit in the package.

In order to test the performance of the circuits in a package, the contacts on the testing surface must be in good contact with the side surfaces of the end portions of the leads of the package. For this reason, in conventional semiconductor chip package handling and testing equipment and accessories, the solenoid and the plunger apply a significant force, urging the package towards the testing surface. For this reason, when the side surfaces of the end portions of the leads come into contact with the testing surface, the leads are bent. Typically the solenoid is controlled so that the plunger would push the package until the bottom surface of the package is within a set stand-off from the testing surface for a particular package. In order to ensure that all the leads are in contact with the testing surface, such stand-off is set to a value so that all the leads will be bent when the solenoid stops exerting any force on the plunger. Such fixed value of the stand-off frequently results in excessive bending of the leads which destroys the coplanarity of the end portions of the leads as explained below.

Semiconductor packages are manufactured by manufacturers with certain tolerances. Thus the side surfaces of the end portions of the leads of a package may deviate from the common plane of coplanarity by a certain value within such tolerances when it is sent by the manufacturer. In the subsequent handling of the package, the leads are subject to various forces which may cause the side surfaces of the end portions of the leads to deviate further from the desired common plane. In the conventional chip package handler design, the solenoid is controlled so that the plunger pushes the package towards the testing surface by a fixed distance. For the reasons explained above, the side surfaces of the end portions of the leads of the packages reaching the handler may already deviate from the desired common plane by a significant amount. When such packages are pushed by the plunger by a fixed distance, the existing deviations of the end portions of the leads causes uneven bending of the leads. Such further uneven bending will frequently cause the side surfaces of the end portions of the leads to deviate from the desired common plane by distances greater than that acceptable by the chip user. Such chip packages must either be discarded or the leads reformed in a costly and time-consuming process.

An even greater problem can arise if, within the same batch of packages to be tested, the planes of desired coplanarity of packages in the batch are at different distances from the package body. Thus the plane of desired coplanarity of some packages may be at 25 mils from the package body while those of other packages are at 27 mils. Therefore, if the distance of travel by the plunger is fixed in reference to the packages with planes of coplanarity at 25 mils from the package body, the plunger will cause leads to be severely bent in packages whose planes of coplanarity is at 27 mils to the package body. It is therefore desirable to provide an improved system for handling and positioning the package with respect to the testing surface where such difficulties are avoided.

SUMMARY OF THE INVENTION

This invention is based on the observation that the above-described difficulties can be avoided by monitoring the distance between the package (or the leads thereof) and the testing surface so that the distance between the end portions of the leads and the testing surface can be monitored. The movement of the plunger is controlled in view of this information so that the plunger pushes the package towards the testing surface by only a predetermined distance so as to maintain the coplanarity of the end portions of the leads while at the same time achieving good contact between the end portions of the leads and the contacts on the testing surface for testing purposes.

This invention is directed towards an apparatus for handling and positioning a semiconductor chip package with respect to a testing device for testing the package. The device includes a testing surface. The package has leads wherein at least some of the leads have elongated end portions and the portions have side surfaces that are substantially coplanar. The testing surface is adapted to contact the side surfaces of the end portions simultaneously to permit testing of the package. The apparatus comprises means for supporting the package in a position such that said side surfaces of the end portions are adjacent to said testing surface, and means for urging the package and the end portions towards the testing surface. The apparatus further comprises means for monitoring the distance between said package and said testing surface and for providing a signal when said distance is substantially equal to a set value; and means for causing said urging means to drive the package towards said testing surface by a predetermined distance in response to the signal.

DETAILED DESCRIPTION OF THE INVENTION

Figure 1:
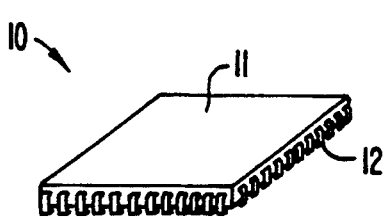
FIG. 1 is a perspective view of a PLCC-type package to illustrate the invention.
Figure 2:
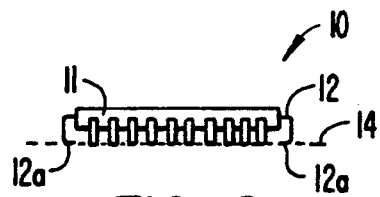
FIG. 2 is a side elevational view of the package of FIG. 1 to illustrate the invention.

FIG. 1 is a perspective view of a PLCC-type package useful for illustrating the invention. As shown in FIG. 1, package 10 includes leads 12 which are bent into a J-shaped member more clearly shown in FIGS. 2, 4. The end portions of leads 12 have side surfaces 12a which are substantially coplanar. As shown in FIG. 2, the side surfaces of the end portions of leads 12 are substantially coplanar and are in the plane 14. In this context, the side surfaces 12a being coplanar means that the side surfaces 12a are positioned such that they will not deviate from plane 14 by more than a predetermined distance. As is known to those skilled in the art, it is important to maintain the side surfaces 12a coplanar so that when they are soldered or welded to a substrate, such as a printed circuit board, good quality connections will be made. If the side surfaces 12a deviate by more than the predetermined distance so that they are no longer coplanar, the connections made between the side surfaces and the substrate will likely have poor quality. It is desirable therefore to maintain the side surfaces 12a substantially coplanar when it is handled for testing purposes.

Figure 3:
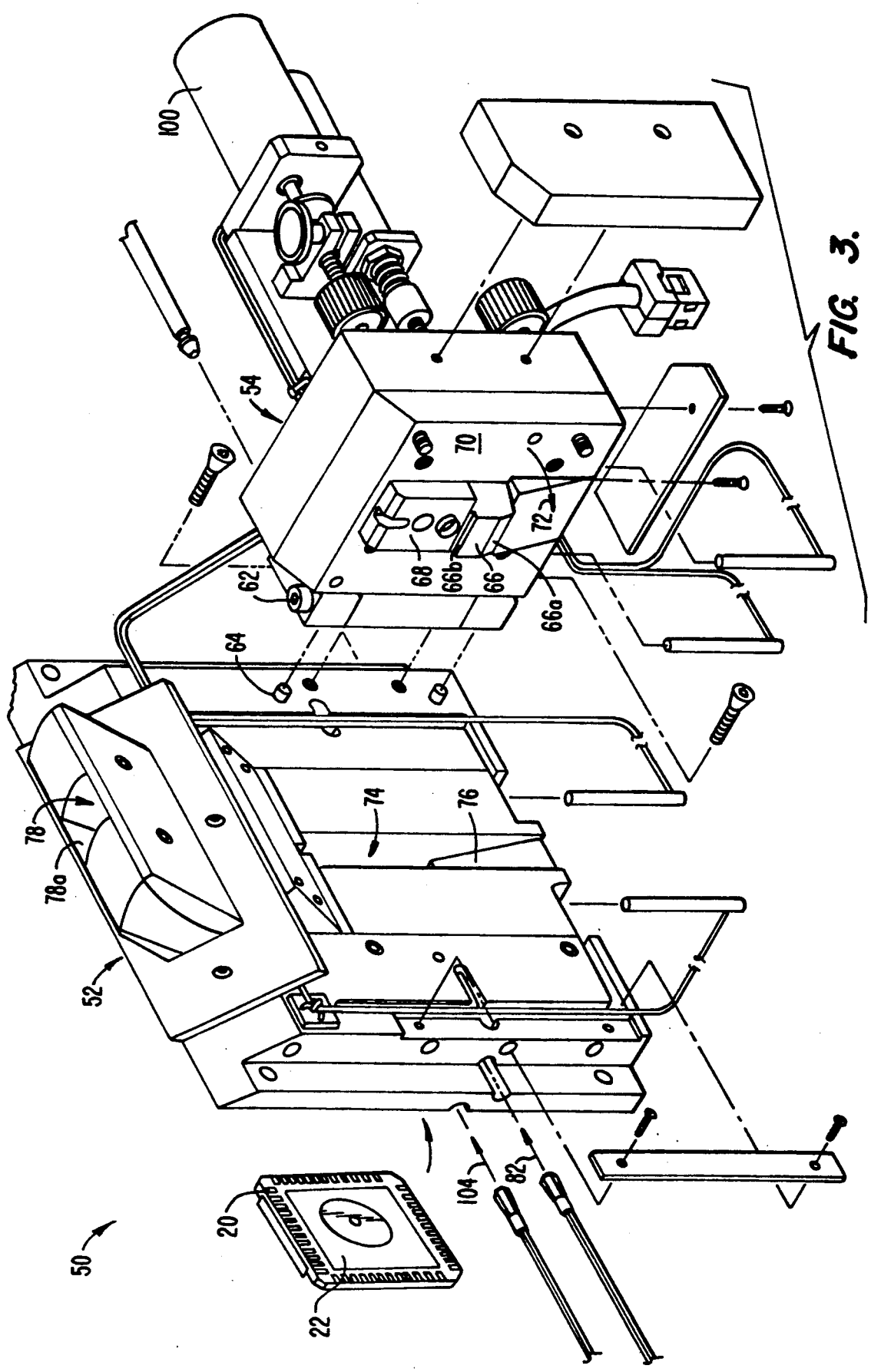
FIG. 3 is a perspective view of portions of a semiconductor chip package handler for handling and positioning a semiconductor chip package with respect to a testing surface for testing the package, useful for illustrating the invention.

Before a semiconductor chip package, such as package 10, is shipped to a customer, it is necessary to test electrical characteristics of the circuits contained in the package. For this purpose, the side surfaces 12a of the end portions of leads 12 are made to contact electrical contacts of a testing surface, such as contacts 20 on testing surface 22 of FIGS. 3–5. FIG. 3 is a perspective view of some of the components of a trigon handler 50 for handling and positioning package 10 with respect to contacts 20 and testing surface 22, to permit testing of the package. For example, the components of Sigma Model 102A, when modified in accordance with the invention described in this application, may be adapted for use as certain components in FIG. 3.

Handler 50 has three major sections: a main contactor assembly section 52, a contactor door assembly 54, and a contactor site assembly (only contacts 20 and test surface 22 of the assembly are shown in FIG. 3). When assembled, hinge 62 of the door assembly 54 is pivotally connected to connectors 64 of the main contactor assembly 52. Door assembly 54 has a movable lip portion 66 for supporting the semiconductor chip package when it is being tested, when the lip is in its forward position. As shown in FIG. 3, lip 66 in its forward position and block 68 above the lip protrude from the surface 70 of the door assembly 54.

Figure 4:
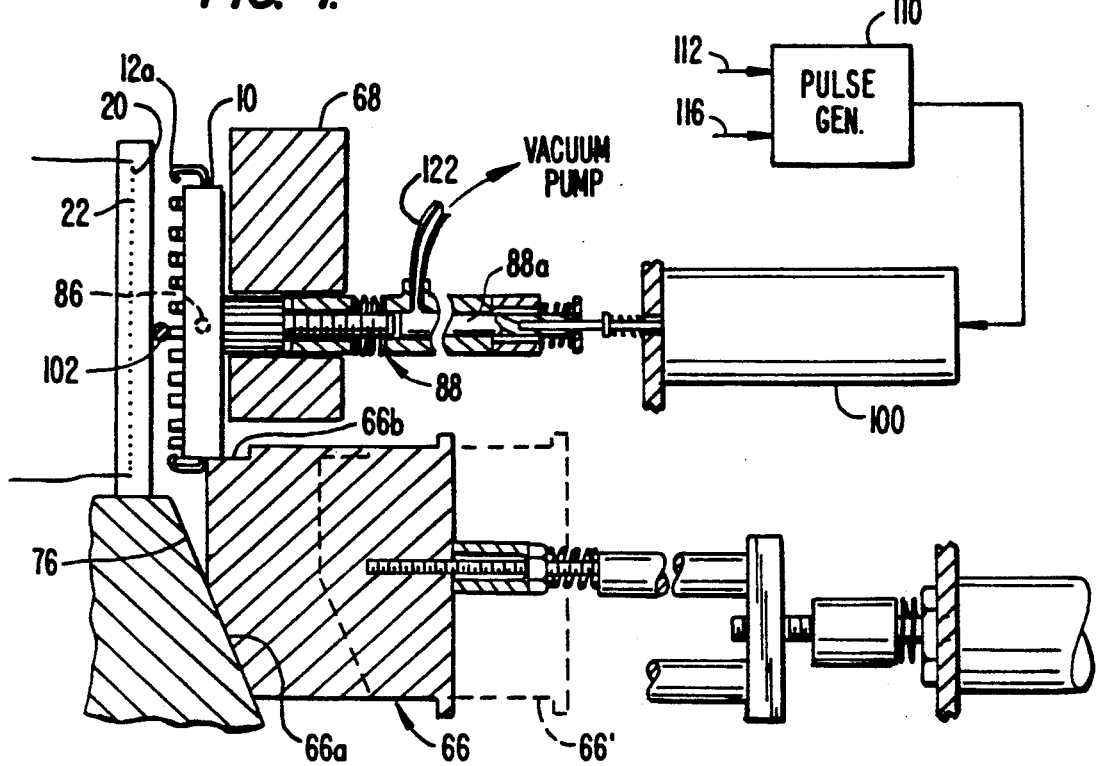
FIG. 4 is a simplified and partially cross-sectional and partially side elevational view of portions of the system of FIG. 3 and of a semiconductor chip package of FIG. 1 with light sensors to illustrate the preferred embodiment of the invention.

Before handler 50 is ready to accept semiconductor chip packages, the door assembly 54 is rotated about hinge 62 along arrow 72 until block 68 and lip 66 fit into slot 74 of the main contactor assembly 52. As will be described in detail below, when lip 66 is in the forward position as shown in FIGS. 3 and 4, the slanting portion 66a is in contact with the slanting surface 76 of the main contactor assembly. After the door assembly 54 is closed in the manner described, a semiconductor chip package may be fed into channel 78. Package 10 is oriented when fed into the channel such that the leads 12 face surface 78a of the channel. When lip 66 is in its forward position, the plastic body portion 11 (see FIG. 1) of package 10 is supported by the recess portion 66b of the lip as shown more clearly in FIG. 4.

Figure 5:
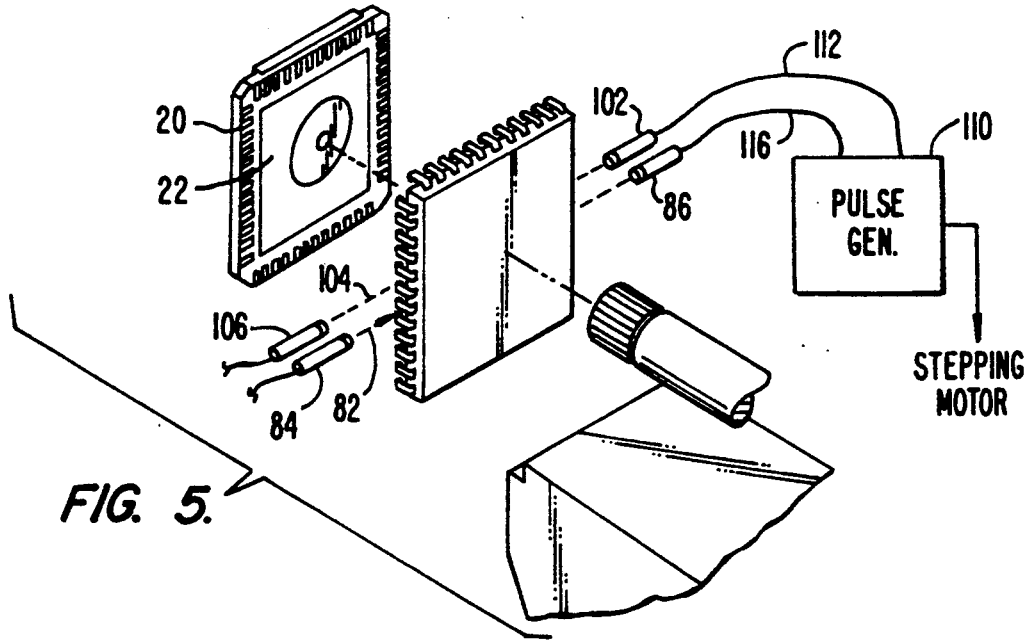
FIG. 5 is a perspective view of a semiconductor chip package and of certain elements in FIG. 4 to illustrate the preferred embodiment of the invention.

Handler 50 includes another major section, namely the contactor site assembly (a small part of which is shown in FIG. 3) which includes contacts 20 and the testing surface 22 shown in FIGS. 4 and 5. When handler 50 is assembled, the contactor site assembly contacts the main contactor assembly 52 on the opposite side from that of the door assembly 54 such that contacts 20 and the testing surface 22 will appear on the other side of the slot 74 than the door assembly 54. Thus when package 10 passes through channel 78 and is supported by a recess portion 66b of the lip 66, the side surfaces 12a of the end portions of leads 12 will be adjacent to and face contacts 20 on testing surface 22, as shown more clearly in FIG. 4.

The next steps in the operation of the handler 50 will be described by reference to FIGS. 3, 4 and 5. FIG. 4 is a simplified, partially schematic and partially side elevational view of package 10 and only certain elements of handler 50 to illustrate the preferred embodiment of the invention. Thus many of the components of FIG. 3 are not shown in FIG. 4 to simplify the drawing. As described above, when the three main sections of handler 50 are assembled (as is the case in FIG. 4), leads 20 and testing surface 22 face and are adjacent to block 68. As shown in FIG. 4, a space is left between block 68 and testing surface 22 for package 10, so that when package 10 falls through channel 78 and is stopped by recessed portion 66b of lip 66, package 10 will be adjacent to testing surface 22 with the side surfaces 12a facing contacts 20 as shown in FIG. 4.

In the conventional design of a chip package handler, the presence of package 10 in the space between block 68 and testing surface 22 is sensed by a light sensor 82 in FIGS. 4 and 5. As shown more clearly in FIG. 5, a light beam 82 from source 84 is received by detector 86. When package 10 falls through channel 78 into the space between block 68 and testing surface 22, it blocks the light beam 82. When sensor 86 senses that the light beam has been blocked, it activates a solenoid in a conventional design to drive a plunger assembly 88 which pushes package 10 towards testing surface 22. In the conventional handler assembly, no attempt is made to detect the position of package 10 relative to testing surface 22; instead, the solenoid is operated causing plunger 88 to push package 10 by a set distance. In order to ensure that surfaces 12a are in contact with contacts 20 of the testing surface 22, such set distance is normally fixed. As explained above, however, this in turn frequently causes the leads 12 to lose their coplanarity. When this happens, the package 10 has to be discarded or the bent leads 12 will have to be reshaped, which is a costly and time-consuming process. It is therefore desirable to provide an improved handler in which such difficulties are avoided.

In contrast to the conventional design, the invention contemplates the monitoring of the distance between package 10 and testing surface 22; in particular, the distance between the side surface 12a of the end portion of one of the leads 12 and the testing surface 22 is monitored. The information obtained from such monitoring is used to control a stepping motor, which is capable of driving the plunger by small steps of set distances. The steps can be quite small so that accurate results are obtained. The stepping motor is stopped at the appropriate moment to prevent destroying coplanarity of the leads while achieving good contacts between surfaces 12a and contacts 20 of the testing surface. In contrast to the conventional design, the stepping motor does not cause the plunger to drive all packages by the same fixed .distance. Instead, the distance between the package and the testing surface is monitored and the information obtained by the monitoring is used to control the distance by which the package is pushed. Therefore, even if the side surfaces of the end portions of the leads deviate somewhat from the desired common plane such as plane 14, or if the desired common planes 14 of different packages are at different distances from the package body, the monitoring of the distance between one of such leads and the testing surface will reduce the chances for bending the leads to the extent that coplanarity is destroyed. The result can be further improved by employing a plurality of light sources 106 and the same number of corresponding light detectors 102 spread out in the space between block 68 and testing surface 22 for testing the positions of surfaces 12a of different leads of the package 10, and by averaging the results of the detection to set the delay in pulse generator 110. These features further reduce the chances of destroying coplanarity of the leads. Such plurality of light sources and detectors may, for example, be spread along a plane within the space between block 68 and testing surface 22 where the plane is substantially parallel to testing surface 22.

As shown in FIG. 4, the solenoid of the conventional design has been replaced by a stepping motor 100. The position of the surface 12a of a lead 12 relative to testing surface 22 is monitored by a second light sensor 102. Thus when package 10 is slid down channel 78 to block beam 82 as in the conventional design, light sensor 86 causes the stepping motor 100 to start driving the plunger assembly 88 which in turn pushes package 10 towards testing surface 22. However, after the plunger 88 pushes package 10 towards surface 22 by a small distance in a position illustrated in FIG. 4, the side surface 12a of one of the leads is sensed by sensor 102 when such lead begins to block the light beam 104 originating from source 106. The blocking of the beam is sensed by sensor 102, causing sensor 102 to generate a signal for controlling the stepping motor 100. The stepping motor is thereby caused to stop driving the plunger assembly 88 after a predetermined number of steps. The predetermined number of steps is set to ensure good contact between surfaces 12a of the leads and contacts 20 on the testing surface while maintaining the coplanarity of the surfaces 12a.

The above-described feature in controlling the stepping motor in response to a signal from sensor 102 may be implemented in a variety of ways. In the preferred embodiment, the stepping motor is driven by a pulse generator 110. Thus when package 10 blocks the beam 82, sensor 86 causes the pulse generator 110 to send pulses to stepping motor 100, thereby causing the stepping motor to drive assembly 88. For some stepping motors, each pulse received by the motor will cause the motor to move by one step; it will be understood, however, that stepping motors which operate differently in response to pulses may also be used and are within the scope of the invention. Thus upon receiving pulses from generator 110, motor 100 will cause the plunger assembly 88 to push package 10 towards surface 22. When the signal from sensor 102 indicating that beam 104 is beginning to be blocked by a lead reaches the pulse generator 110 through line 112, the pulse generator 110 is set so as to stop sending pulses to motor 100 after a certain set delay. The delay is set to permit a set number of pulses to be sent to motor 100 after receiving such signal from sensor 102 indicating that surface 12a of one of the leads has now reached a certain predetermined distance from surface 22. In this manner, the stepping motor is permitted to further step by a set number of steps thereby causing package 10 to be driven by a set distance after sensor 102 detects the presence of a lead. Since sensor 102 is located at a predetermined distance from testing surface 22, the number of steps of motor 100 required to put surfaces 12a at a desired location relative to testing surface 22 may be readily calculated.

After completion of the testing procedure of package 10, lip 66 is withdrawn to the withdrawn position 66' in dotted lines in FIG. 4, which permits package 10 to drop through the space between the lip 66 and surface 76 for further processing. To reduces the chances that leads 12 will be bent when it is stopped by recessed portion 66b of the lip, the plunger assembly 88 is provided with a vacuum producing means as shown in FIG. 4. The plunger assembly 88 is hollow and has a chamber 88a therein. Chamber 88a is connected to a vacuum line 122 connected to a vacuum pump (not shown). The vacuum pump is turned on before package 10 is fed through channel 78. When package 10 reaches the space between block 68 and testing surface 22, the force of suction within chamber 88a will cause package 10 to be in contact with the plunger assembly 88 as shown in FIG. 4; this reduces the chances of bending the leads and ensures that package 10 is in the correct orientation when motor 100 starts its drive, causing assembly 88 to push the package 10 towards surface 22.

The force of suction within chamber 88a is also adequate to hold package 10 even after it clears the recess portion 66b and is no longer supported by lip 66 when package 10 is being pushed towards surface 22. As a further measure to prevent the destruction of coplanarity of leads 12, contacts 20 are in the form of leads at a small distance from the testing 22; this permits contacts 20 to bend slightly when pushed by surfaces 12a. The compliance of contacts 20 therefore further reduces the risk of destroying the coplanarity of the leads 12.

While the invention is described with respect to a PLCC package, it will be understood that this invention is equally applicable to other types of packages such as quad flat packs with only minor modifications of the components shown in the figures. In the preferred embodiment described above, the distance between package 10 or any portion thereof and the testing surface is monitored by a light sensor; it will be understood that other means for monitoring the distance may be used and are within the scope of the invention. While a stepping motor is used to push package 10, it will be understood that other driving devices may also be used instead and is within the scope of the invention. The feature of further driving the package towards the testing surface by a set distance is accomplished by a set delay within the pulse generator, it will be understood that other means for driving motor 100 and for setting such predetermined distance may be used and are within the purview of the invention. Still other modifications may be made without departing from the scope of the invention which is to be limited only the appended claims.

What is claimed is:

1. An apparatus for handling and positioning a semiconductor chip package with respect to a testing device for testing the package, said device including a testing surface thereon, said package having leads wherein at least some of said leads have elongated end portions, said portions having side surfaces that are substantially copolanar, said testing surface adapted to contact said side surfaces of said end portions simultaneously to permit testing of the package, said apparatus comprising:

means for urging the package and the end portions towards the testing surface;

means for monitoring a distance between at least one of the end portions of the leads of said package and said testing surface and for providing triggering information when said distance is substantially equal to a set value; and means for causing said urging means to drive said package towards said testing surface by a predetermined distance upon receiving said triggering information.

2. The apparatus of claim 1, wherein said urging means is a stepping motor.

3. The apparatus of claim 2, said causing means being a pulse generator for applying drive signal pulses to the stepping motor, causing the motor to drive the package by steps of preset distance.

4. The apparatus of claim 3, wherein said pulse generator stops providing drive signal pulses to the motor at a predetermined time after receiving the signal from the monitoring means, so that said motor drives said package towards said testing surface by said predetermined distance in response to said signal.

5. The apparatus of claim 1, wherein said monitoring means is a light sensor.

6. The apparatus of claim 1, wherein said monitoring means monitors the distance between the end portions of the leads of said package and said testing surface.

7. The apparatus of claim 1, wherein said urging means includes vacuum means for pulling the package towards the urging means.

8. The apparatus of claim 1, wherein said predetermined distance is substantially equal to said set value.

9. The apparatus of claim 1, wherein said monitoring means monitors the distances between a plurality of the end portions of the leads and said testing surface and provides said triggering information when an average distance between the said plurality of end portions and the testing surface is substantially equal to said set value.

10. An apparatus for handling and positioning a semiconductor chip package with respect to a testing device for testing the package, said device including a testing surface thereon, said package having leads wherein at least some of said leads have elongated end portions, said portions having side surfaces that are substantially coplanar, said testing surface adapted to contact said side surfaces of said end portions simultaneously to permit testing of the package, said apparatus comprising:

means for urging the package and the end portions towards the testing surface;

means for monitoring distance between said package and said testing surface and for providing triggering information when said distance is substantially equal to a set value; and means for causing said urging means to drive said package towards said testing surface by a predetermined distance upon receiving said triggering information, said predetermined distance selected such that said urging means causes the leads of said package to make physical contact with said testing surface without significantly bending the leads.

* * * * *